(12) United States Patent
Freitag et al.

(10) Patent No.: US 9,177,588 B2
(45) Date of Patent: Nov. 3, 2015

(54) RECESSED IRMN READER PROCESS

(71) Applicant: HGST Netherlands B.V., Amsterdam (NL)

(72) Inventors: James Mac Freitag, Sunnyvale, CA (US); Ying Hong, Morgan Hill, CA (US); Cherngye Hwang, San Jose, CA (US); Stefan Maat, San Jose, CA (US); Masaya Nishioka, Kawasaki (JP); David John Seagle, Morgan Hill, CA (US); Hicham Moulay Sougrati, Elk Grove, CA (US); Shuxia Wang, San Jose, CA (US); Yi Zheng, San Ramon, CA (US); Honglin Zhu, Fremont, CA (US)

(73) Assignee: HGST NETHERLANDS B.V., Amsterdam (NL)

( * ) Notice: Subject to any disclaimer, the term of this patent is extended or adjusted under 35 U.S.C. 154(b) by 122 days.

(21) Appl. No.: 14/158,552

(22) Filed: Jan. 17, 2014

(65) Prior Publication Data
US 2015/0206550 A1    Jul. 23, 2015

(51) Int. Cl.
*H01L 21/00* (2006.01)
*G11B 5/85* (2006.01)
*G11B 5/855* (2006.01)
*G11B 5/11* (2006.01)
*G11B 5/60* (2006.01)

(52) U.S. Cl.
CPC .. *G11B 5/85* (2013.01); *G11B 5/11* (2013.01); *G11B 5/6082* (2013.01); *G11B 5/855* (2013.01)

(58) Field of Classification Search
USPC ............................................................ 438/3
See application file for complete search history.

(56) References Cited

U.S. PATENT DOCUMENTS

| | | | |
|---|---|---|---|
| 5,898,547 A | 4/1999 | Fontana, Jr. et al. | |
| 6,891,703 B2 | 5/2005 | Hasegawa | |
| 7,045,224 B2 | 5/2006 | Hasegawa et al. | |
| 7,369,371 B2 | 5/2008 | Freitag et al. | |
| 7,599,155 B2 | 10/2009 | Saito et al. | |
| 7,978,441 B2 | 7/2011 | Lin et al. | |
| 8,395,867 B2 | 3/2013 | Dimitrov et al. | |
| 2007/0146939 A1* | 6/2007 | Pinarbasi | 360/324.11 |
| 2009/0021870 A1 | 1/2009 | Pinarbasi | |
| 2013/0027032 A1 | 1/2013 | Gao et al. | |
| 2015/0116870 A1* | 4/2015 | Singleton et al. | 360/319 |

OTHER PUBLICATIONS

Freitag, James Mac et al.; U.S. Appl. No. 13/923,624, filed Jun. 21, 2013; entitled "Narrow Read-Gap Head With Recessed AFM".

* cited by examiner

*Primary Examiner* — Asok K Sarkar
(74) *Attorney, Agent, or Firm* — Patterson & Sheridan, LLP

(57) ABSTRACT

The embodiments of the present invention relate to a method for forming a magnetic read head with pinned layers extending to the ABS of the read head and magnetically coupled with an antiferromagnetic layer that is recessed in relation to the ABS of the read head. Portions of the antiferromagnetic layer and a magnetic layer that are extending to the ABS are removed, exposing a shield. A shielding material is formed on the exposed shield and a seed layer is formed on the shield and on or over a portion of the remaining antiferromagnetic layer. A pinned layer structure is formed on the seed layer and the magnetic layer.

20 Claims, 11 Drawing Sheets

RECESSED IRMN READER PROCESS

BACKGROUND

1. Field

Embodiments of the present invention generally relate to a magnetic read head for use in a hard disk drive.

2. Description of the Related Art

The heart of a computer is a magnetic disk drive which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider towards the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing, the write and read heads are employed for writing magnetic impressions to and reading magnetic signal fields from the rotating disk. The read and write heads are connected to processing circuitry that operates according to a computer program to implement the writing and reading functions.

The read head typically utilizes a spin valve sensor, also referred to as a giant magnetoresistive (GMR) sensor. The sensor at the ABS typically includes a barrier layer sandwiched between a pinned layer and a free layer, and an antiferromagnetic layer for pinning the magnetization of the pinned layer. The magnetization of the pinned layer is pinned perpendicular to the ABS and the magnetic moment of the free layer is located parallel to the ABS, but free to rotate in response to external magnetic fields.

The need for ever increased data density is pushing researchers to develop data recording systems that can read and record ever smaller bit lengths in order to increase the density of data recorded on a magnetic medium. This has led to a push to decrease the gap thickness of a read head such as a GMR head. However, the amount by which such gap thickness can be decreased has been limited by physical limitations of sensors and also by the limitations of currently available manufacturing methods.

A self-pinned sensor in which the antiferromagnetic layer is reduced in thickness or removed completely so as to not provide a pinning field for the pinned layer structure provides a method to reduce the read gap. The self-pinned sensor is, however, sensitive to magnetic disturbances caused, for instance, by a head-media impact, which may flip the polarity of the amplitude of the output signal from the read head. Such a failure would reduce the reliability of the recording system.

Therefore, there is a need for an improved magnetic head and method of manufacture that can reduce the read gap thickness while still preserving the reliability of the magnetic head.

SUMMARY OF THE INVENTION

The embodiments of the present invention relate to a method for forming a magnetic read head with pinned layers extending to the ABS of the read head and in contact with an antiferromagnetic layer that is recessed in relation to the ABS of the read head. Portions of the antiferromagnetic layer and a magnetic layer that are extending to the ABS are removed, exposing a shield. A shielding material is formed on the exposed shield and a seed layer is formed on the shield and on or over a portion of the remaining antiferromagnetic layer. A pinned layer structure is formed on the seed layer and the magnetic layer.

In one embodiment, a method for forming a magnetic read head is disclosed. The method includes depositing an antiferromagnetic layer over a first shield and depositing a first magnetic layer over the antiferromagnetic layer. The first shield, the antiferromagnetic layer and the first magnetic layer have a first portion extending to an ABS. The method further includes removing the first portion of the magnetic layer and the first portion of the antiferromagnetic layer to expose the first portion of the first shield, where the magnetic layer and the antiferromagnetic layer are recessed from the ABS, depositing a shielding material over the first portion of the first shield, removing a portion of the shielding material and a second portion of the first magnetic layer to expose a second portion of the antiferromagnetic layer, depositing a first seed layer over the shielding material and the second portion of the antiferromagnetic layer, depositing a pinned layer structure over the first seed layer and a third portion of the first magnetic layer with the pinned layer structure magnetically coupled to the third portion of the first magnetic layer, depositing a non-magnetic tunnel barrier or spacer layer over the pinned layer structure, and depositing a free layer over the barrier or spacer layer.

In another embodiment, a method for forming a magnetic read head is disclosed. The method includes depositing an antiferromagnetic layer over a first shield and depositing a first magnetic layer over the antiferromagnetic layer. The first shield, the antiferromagnetic layer and the first magnetic layer have a first portion extending to an ABS. The method further includes removing the first portion of the magnetic layer and the first portion of the antiferromagnetic layer to expose the first portion of the first shield, where the magnetic layer and the antiferromagnetic layer are recessed from the ABS, depositing a shielding material over the first portion of the first shield, removing a portion of the shielding material and a second portion of the first magnetic layer so the remaining first magnetic layer has a third portion having a first thickness and a fourth portion having a second thickness, where the second thickness is greater than the first thickness, depositing a first seed layer over the shielding material and the third portion of the first magnetic layer, depositing a pinned layer structure over the first seed layer and the fourth portion of the first magnetic layer with the pinned layer structure magnetically coupled to the fourth portion of the first magnetic layer, depositing a non-magnetic tunnel barrier or spacer layer over the pinned layer structure, and depositing a free layer over the barrier or spacer layer.

In another embodiment, a method for forming a magnetic read head is disclosed. The method includes depositing a first seed layer on a first shield, depositing an antiferromagnetic layer on the first seed layer, depositing a first magnetic layer on the antiferromagnetic layer, depositing a capping layer on the first magnetic layer, and depositing a diamond like carbon layer on the capping layer. The first shield, the antiferromagnetic layer, the first magnetic layer, the capping layer and the diamond like carbon layer have a first portion extending to an ABS. The method further includes removing the first portion of the first seed layer, the first portion of the antiferromagnetic layer, the first portion of the first magnetic layer, the first portion of the capping layer and the first portion of the diamond like carbon layer to expose the first portion of the first shield, where the first seed layer, the magnetic layer, the antiferromagnetic layer, the capping layer and the diamond like carbon layer are recessed from the ABS, depositing a shielding material on the first portion of the first shield, removing a portion of the shielding material and a second portion of the first magnetic layer so the remaining first magnetic layer has a third portion having a first thickness and a fourth portion having a second thickness, wherein the second thickness is greater than the first thickness, depositing a second seed layer on the shielding material and the third portion of the first magnetic layer, depositing a pinned layer structure on the first seed layer and the fourth portion of the first magnetic layer with the pinned layer structure magnetically coupled to the fourth portion of the first magnetic layer, depositing a non-magnetic tunnel barrier or spacer layer over the pinned layer structure, and depositing a free layer on the barrier or spacer layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The embodiments of the present invention relate to a method for forming a magnetic read head with pinned layers extending to the ABS of the read head and in contact with an antiferromagnetic layer that is recessed in relation to the ABS of the read head. Portions of the antiferromagnetic layer and a magnetic layer that are extending to the ABS are removed, exposing a shield. A shielding material is formed on the exposed shield and a seed layer is formed on the shield and on or over a portion of the remaining antiferromagnetic layer. A pinned layer structure is formed on the seed layer and the magnetic layer.

Figure 1:
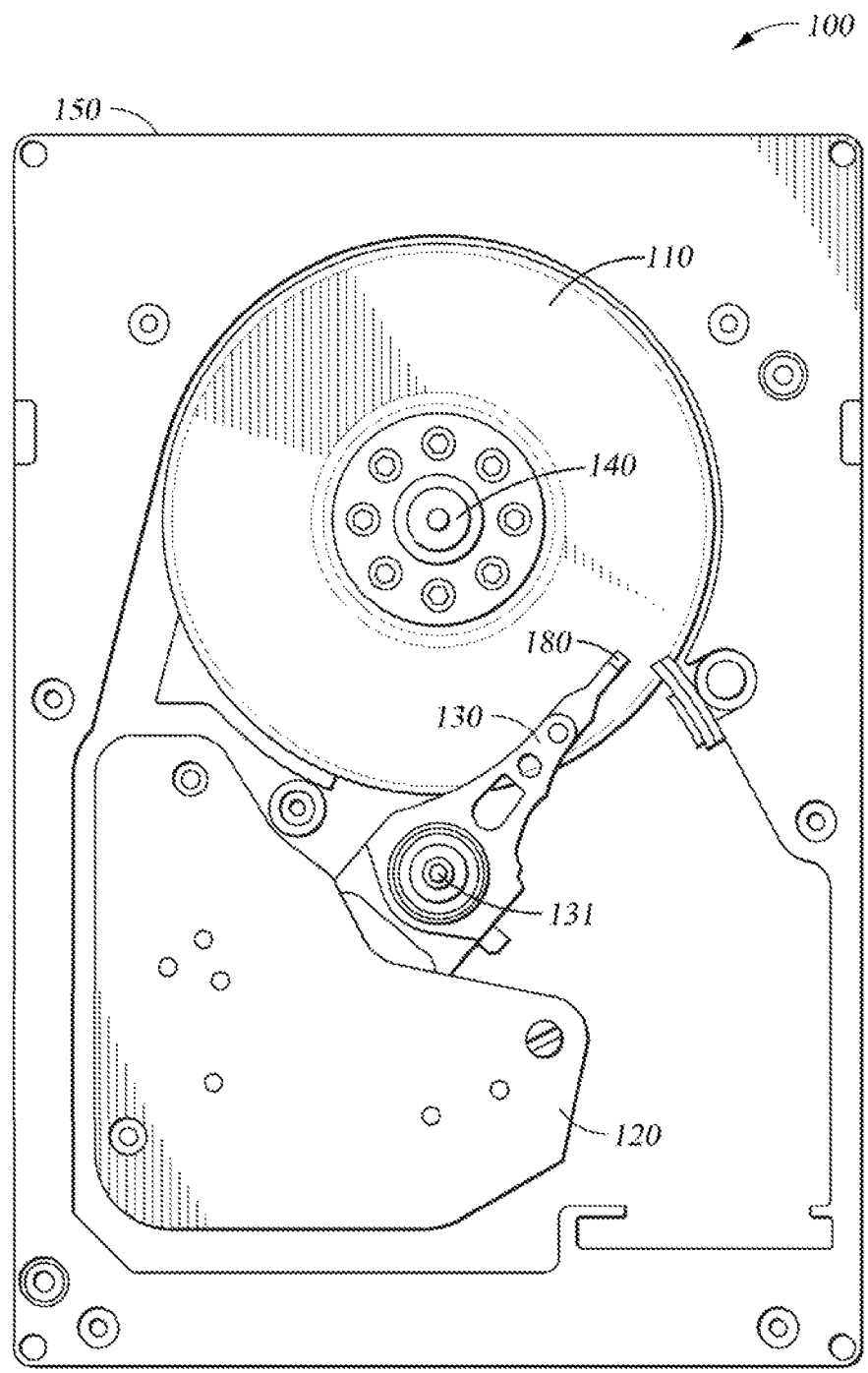
FIG. 1 illustrates an exemplary magnetic disk drive, according to an embodiment of the invention.

FIG. 1 illustrates a top view of an exemplary hard disk drive (HDD) 100, according to an embodiment of the invention. As illustrated, HDD 100 may include one or more magnetic disks 110, actuator 120, actuator arms 130 associated with each of the magnetic disks 110, and spindle motor 140 affixed in a chassis 150. The one or more magnetic disks 110 may be arranged vertically as illustrated in FIG. 1. Moreover, the one or more magnetic disks may be coupled with the spindle motor 140.

Magnetic disks 110 may include circular tracks of data on both the top and bottom surfaces of the disk. A magnetic head 180 mounted on a slider may be positioned on a track. As each disk spins, data may be written on and/or read from the data track. Magnetic head 180 may be coupled to an actuator arm 130 as illustrated in FIG. 1. Actuator arm 130 may be configured to swivel around actuator axis 131 to place magnetic head 180 on a particular data track.

Figure 2:
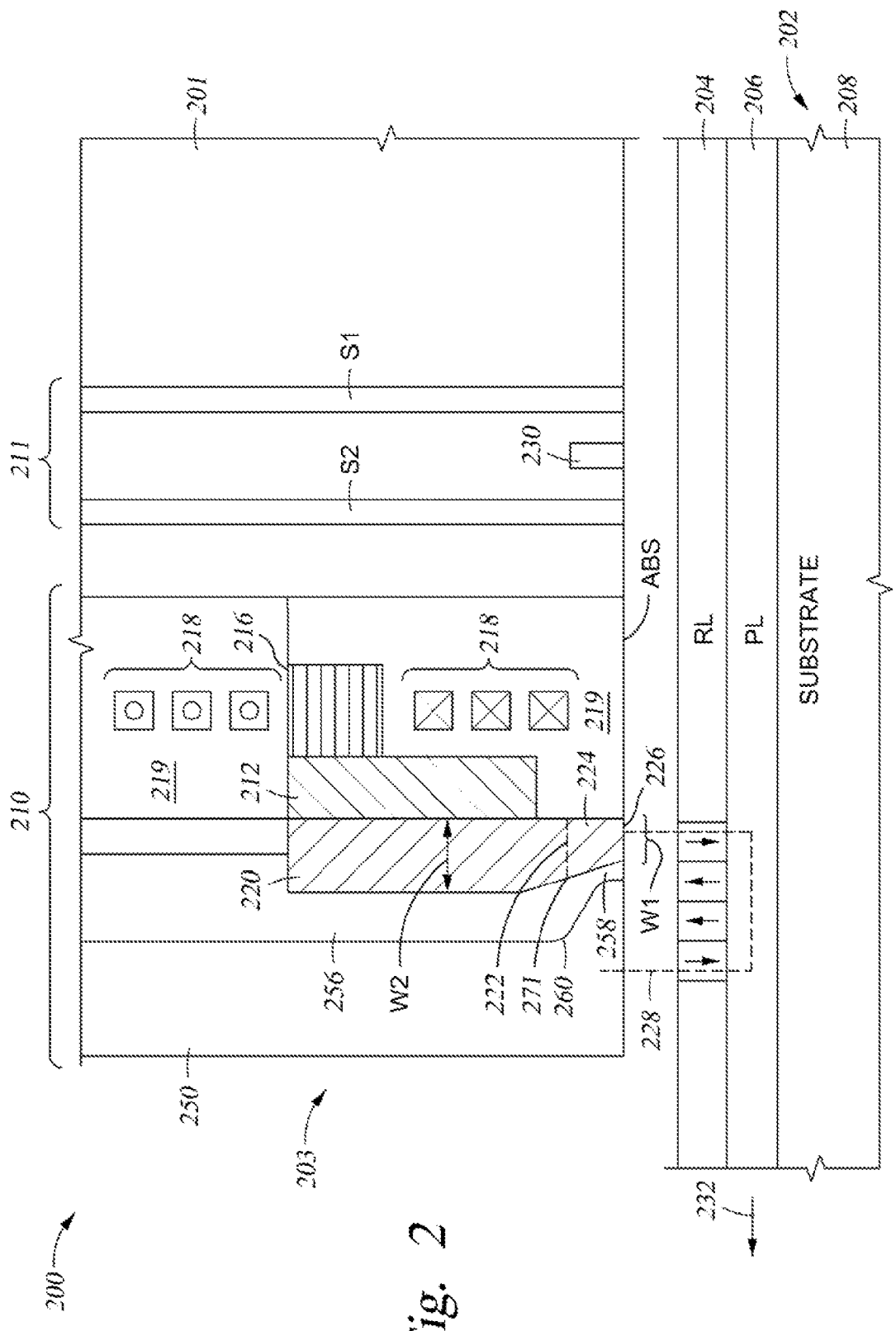
FIG. 2 is a side view of a read/write head and magnetic disk of the disk drive of FIG. 1, according to one embodiment of the invention.

FIG. 2 is a fragmented, cross-sectional side view through the center of a read/write head 200 mounted on a slider 201 and facing magnetic disk 202. The read/write head 200 and magnetic disk 202 may correspond to the magnetic head 180 and magnetic disk 110, respectively in FIG. 1. In some embodiments, the magnetic disk 202 may be a "dual-layer" medium that includes a perpendicular magnetic data recording layer (RL) 204 on a "soft" or relatively low-coercivity magnetically permeable underlayer (PL) 206 formed on a disk substrate 208. The read/write head 200 includes an ABS, a magnetic write head 210 and a magnetic read head 211, and is mounted such that the ABS is facing the magnetic disk 202. In FIG. 2, the disk 202 moves past the write head 210 in the direction indicated by the arrow 232, so the portion of slider 201 that supports the read/write head 200 is often called the slider "trailing" end 203.

The magnetic read head 211 is a MR read head that includes a MR sensing element 230 located between MR shields S1 and S2, which are composed of a highly permeable and magnetically soft material such as permalloy. The distance between S1 and S2, which is the sensor thickness, defines the read gap of the read head. The RL 204 is illustrated with perpendicularly recorded or magnetized regions, with adjacent regions having magnetization directions, as represented by the arrows located in the RL 204. The magnetic fields of the adjacent magnetized regions are detectable by the MR sensing element 230 as the recorded bits.

The write head 210 includes a magnetic circuit made up of a main pole 212 and a yoke 216. The write head 210 also includes a thin film coil 218 shown in the section embedded in non-magnetic material 219 and wrapped around yoke 216. In an alternative embodiment, the yoke 216 may be omitted, and the coil 218 may wrap around the main pole 212. A write pole 220 is magnetically connected to the main pole 212 and has an end 226 that defines part of the ABS of the magnetic write head 210 facing the outer surface of disk 202.

Write pole 220 is a flared write pole and includes a flare point 222 and a pole tip 224 that includes an end 226 that defines part of the ABS. The flare may extend the entire height of write pole 220 (i.e., from the end 226 of the write pole 220 to the top of the write pole 220), or may only extend from the flare point 222, as shown in FIG. 2. In one embodiment the distance between the flare point 222 and the ABS is between about 30 nm and about 150 nm.

The write pole 220 includes a tapered surface 271 which increases a width of the write pole 220 from a first width W1 at the ABS to a second width W2 away from the ABS. In one embodiment, the width W1 may be between around 60 nm and 200 nm, and the width W2 may be between around 120 nm and 350 nm. While the tapered region 271 is shown with a single straight surface in FIG. 2, in alternative embodiment, the tapered region 271 may include a plurality of tapered surface with different taper angles with respect to the ABS.

The tapering improves magnetic performance. For example, reducing the width W1 at the ABS may concentrate a magnetic field generated by the write pole 220 over desirable portions of the magnetic disk 202. In other words, reducing the width W1 of the write pole 220 at the ABS reduces the probability that tracks adjacent to a desirable track are erroneously altered during writing operations.

While a small width of the write pole 220 is desired at the ABS, it may be desirable to have a greater width of the write pole 220 in areas away from the ABS. A larger width W2 of the write pole 220 away from the ABS may desirably increase the magnetic flux to the write pole 220, by providing a greater thickness of the write pole 220 in a direction generally parallel to the ABS. In operation, write current passes through coil 218 and induces a magnetic field (shown by dashed line 228) from the write pole 220 that passes through the RL 204 (to magnetize the region of the RL 204 beneath the write pole 220), through the flux return path provided by the PL 206, and back to an upper return pole 250. In one embodiment, the greater the magnetic flux of the write pole 220, the greater is the probability of accurately writing to desirable regions of the RL 204.

FIG. 2 further illustrates one embodiment of the upper return pole or magnetic shield 250 that is separated from write pole 220 by a nonmagnetic gap layer 256. In some embodiments, the magnetic shield 250 may be a trailing shield wherein substantially all of the shield material is on the trailing end 203. Alternatively, in some embodiments, the magnetic shield 250 may be a wrap-around shield wherein the shield covers the trailing end 203 and also wraps around the sides of the write pole 220. As FIG. 2 is a cross section through the center of the read/write head 200, it represents both trailing and wrap-around embodiments.

Near the ABS, the nonmagnetic gap layer 256 has a reduced thickness and forms a shield gap throat 258. The throat gap width is generally defined as the distance between the write pole 220 and the magnetic shield 250 at the ABS. The shield 250 is formed of magnetically permeable material (such as Ni, Co and Fe alloys) and gap layer 256 is formed of nonmagnetic material (such as Ta, TaO, Ru, Rh, NiCr, SiC or $Al_2O_3$). A taper 260 in the gap material provides a gradual transition from the throat gap width at the ABS to a maximum gap width above the taper 260. This gradual transition in width forms a tapered bump in the non-magnetic gap layer that allows for greater magnetic flux density from the write pole 220, while avoiding saturation of the shield 250.

It should be understood that the taper 260 may extend either more or less than is shown in FIG. 2. The taper may extend upwards to an end of shield 250 opposite the ABS (not shown), such that the maximum gap width is at the end of the shield opposite the ABS. The gap layer thickness increases from a first thickness (the throat gap width) at the ABS to greater thicknesses at a first distance from the ABS, to a final thickness at a second distance (greater than the first distance) from the ABS.

Figure 3A:
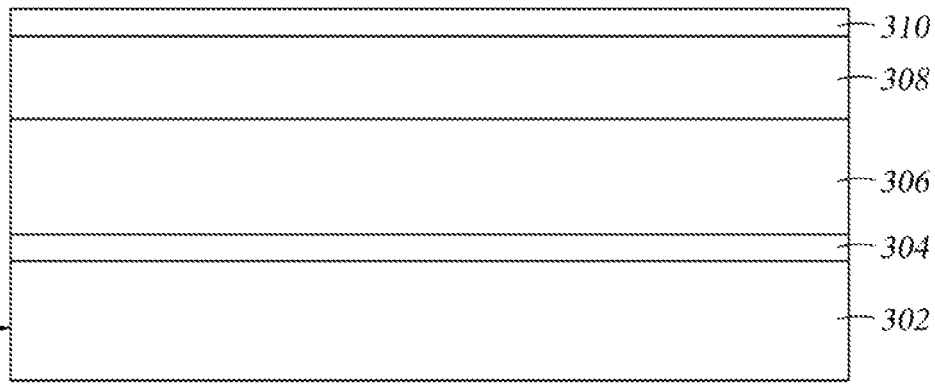
FIGS. 3A-3N illustrate the process of making a magnetic read head according to one embodiment.
Figure 3B:
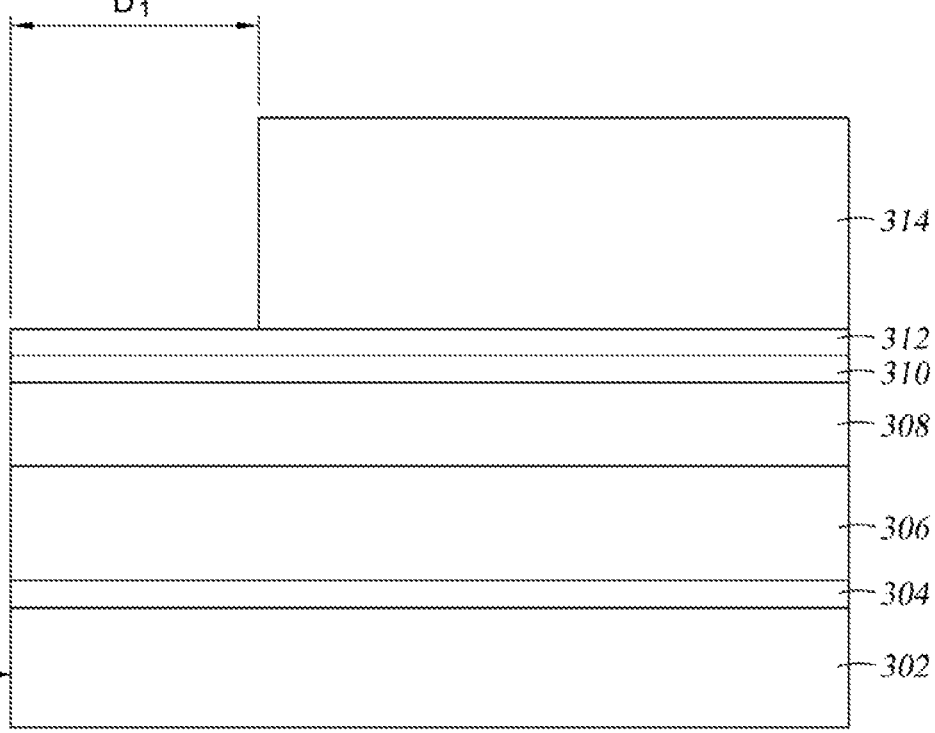
Figure 3C:
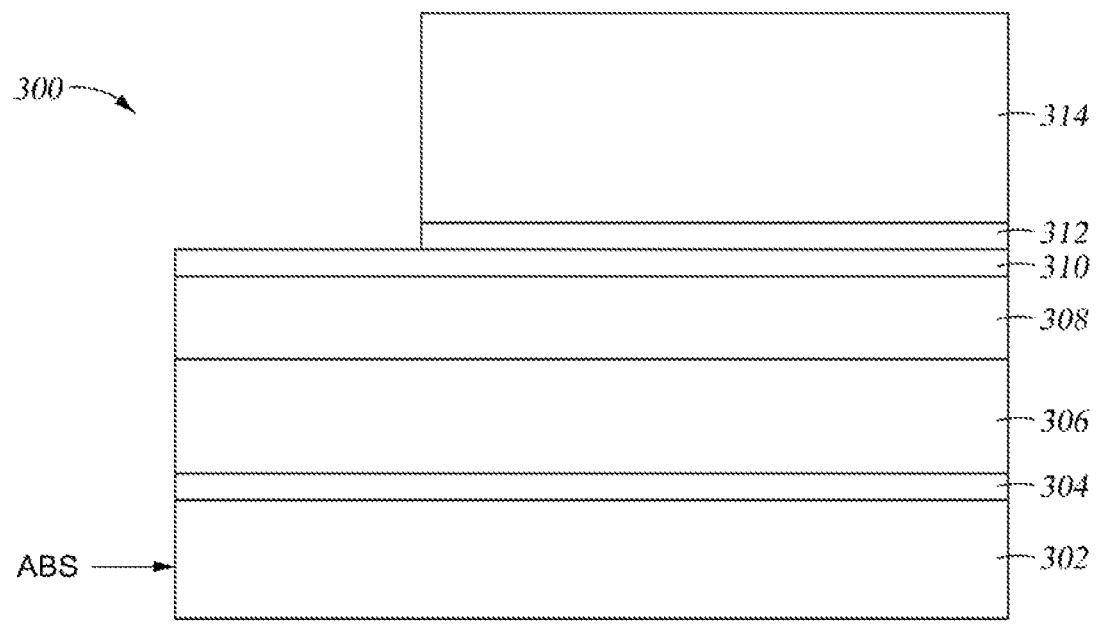
Figure 3D:
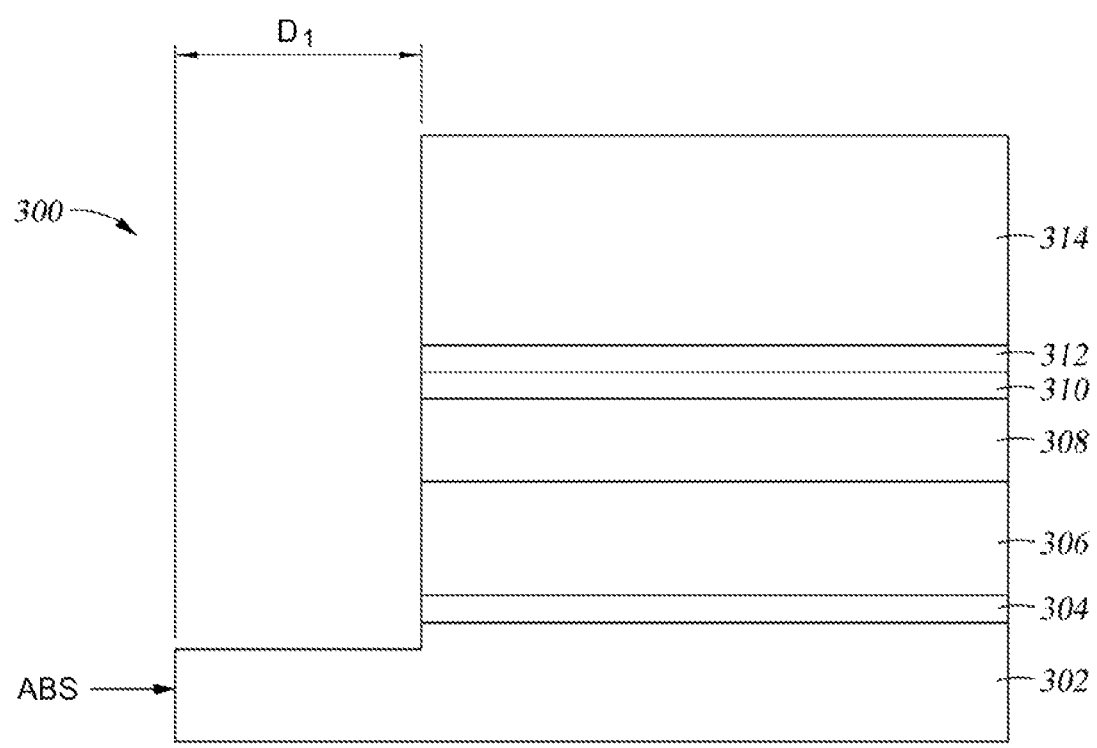
Figure 3E:
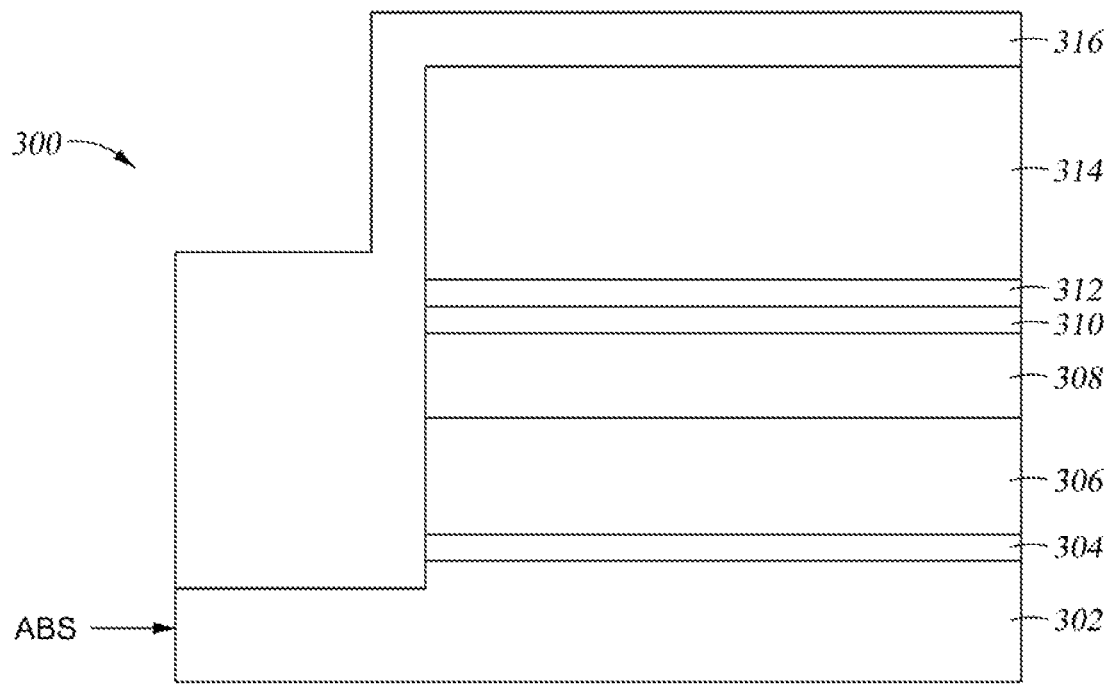
Figure 3F:
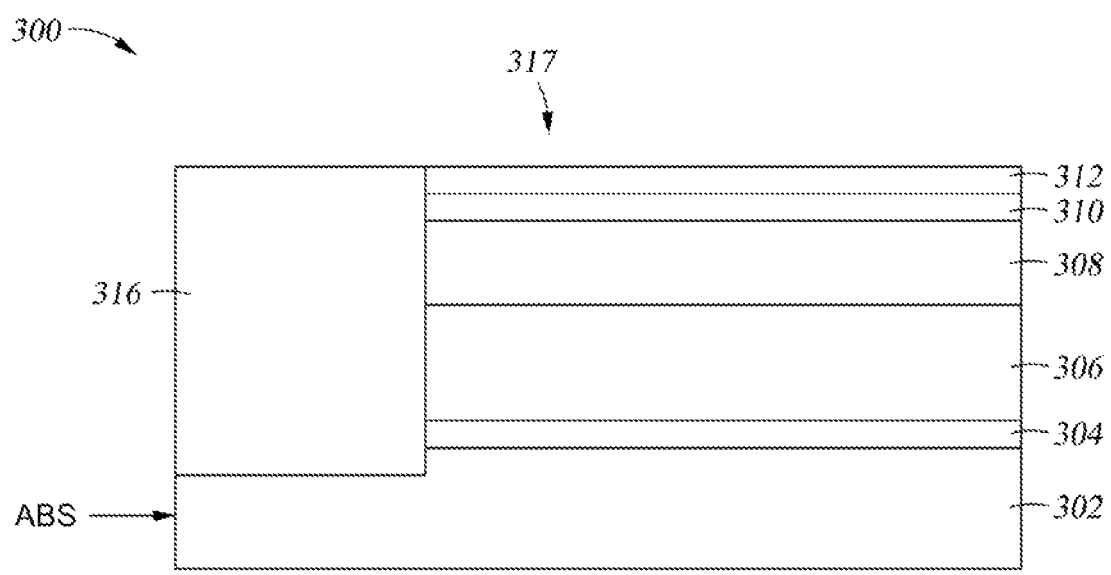
Figure 3G:
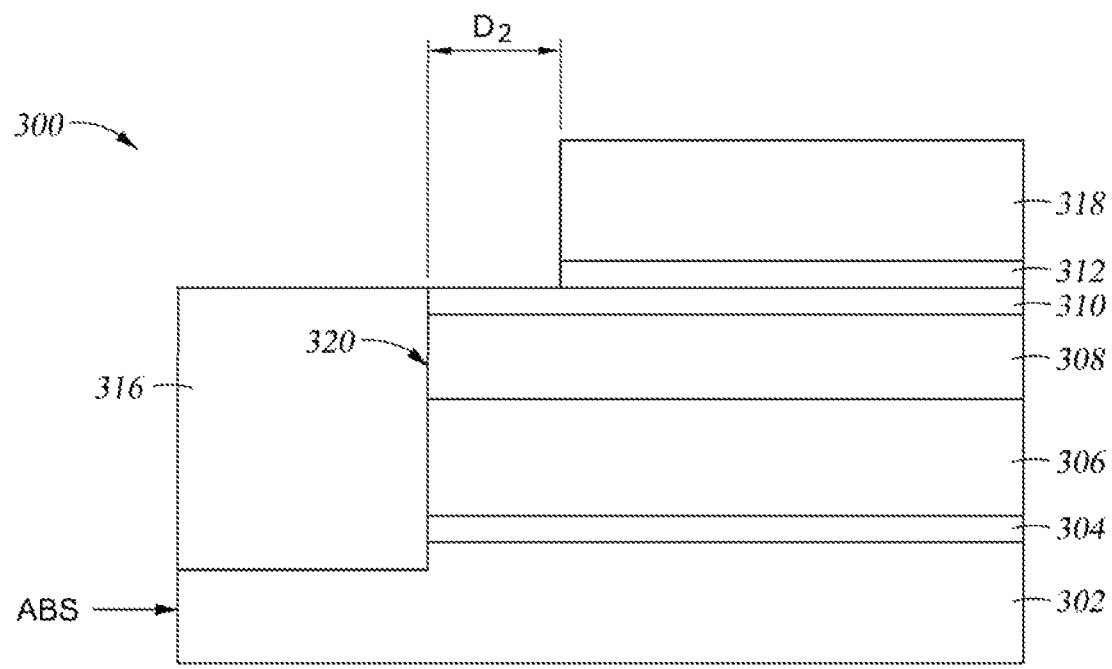
Figure 3H:
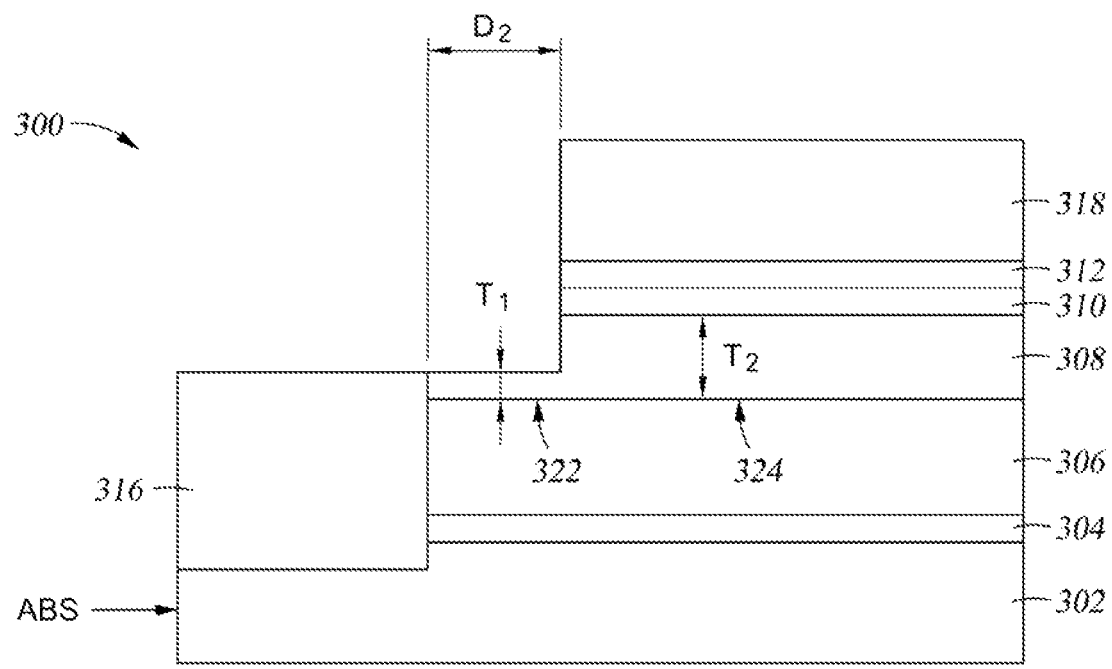
Figure 3I:
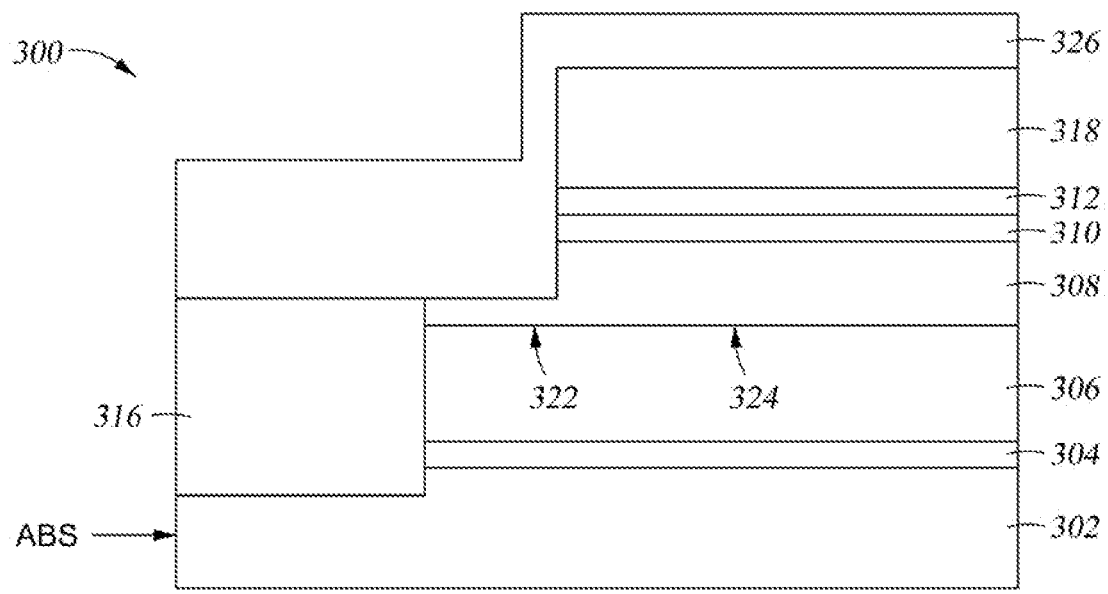
Figure 3J:
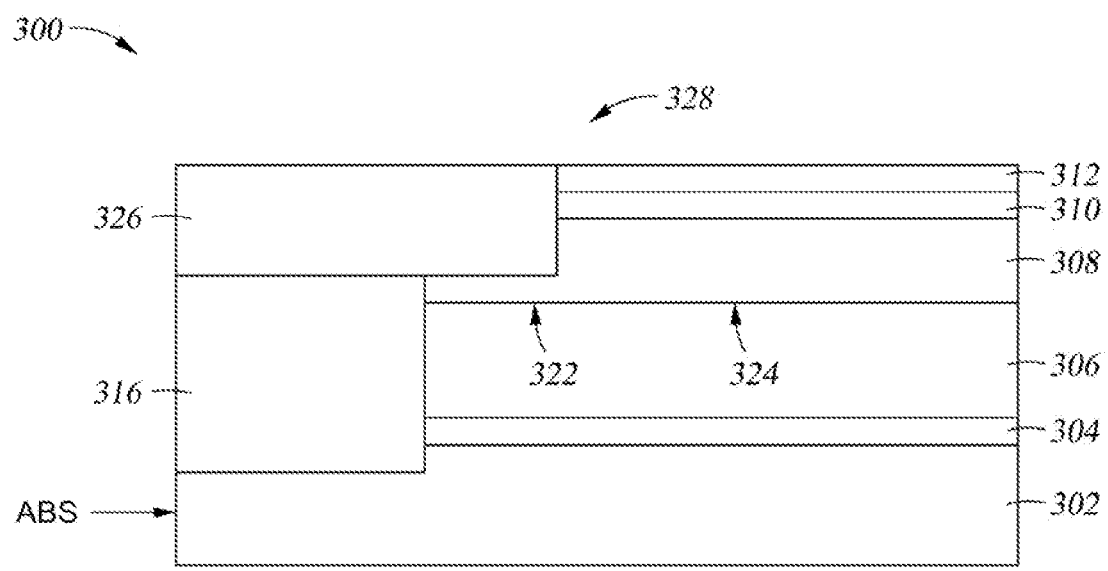
Figure 3K:
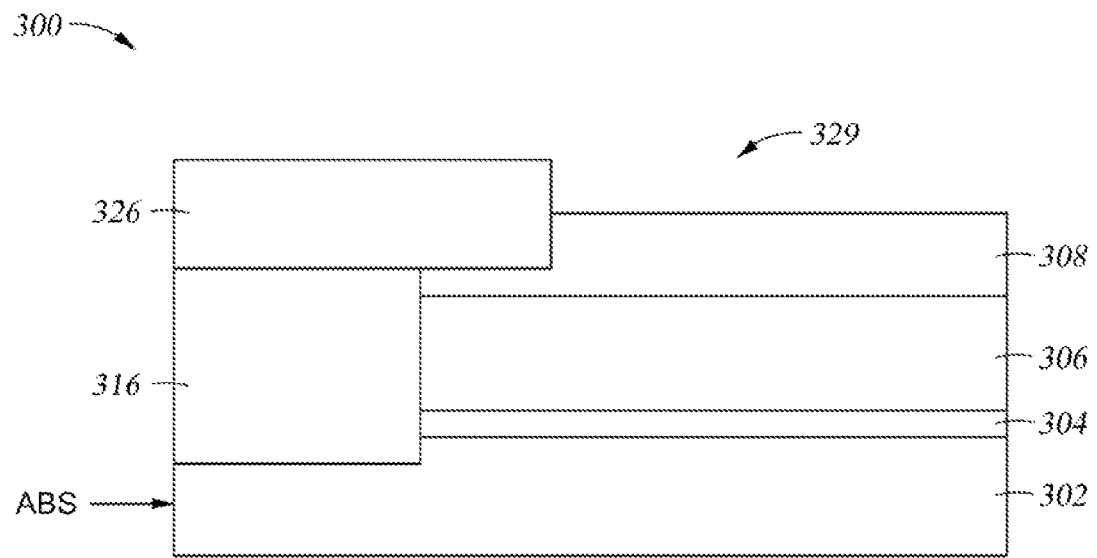
Figure 3L:
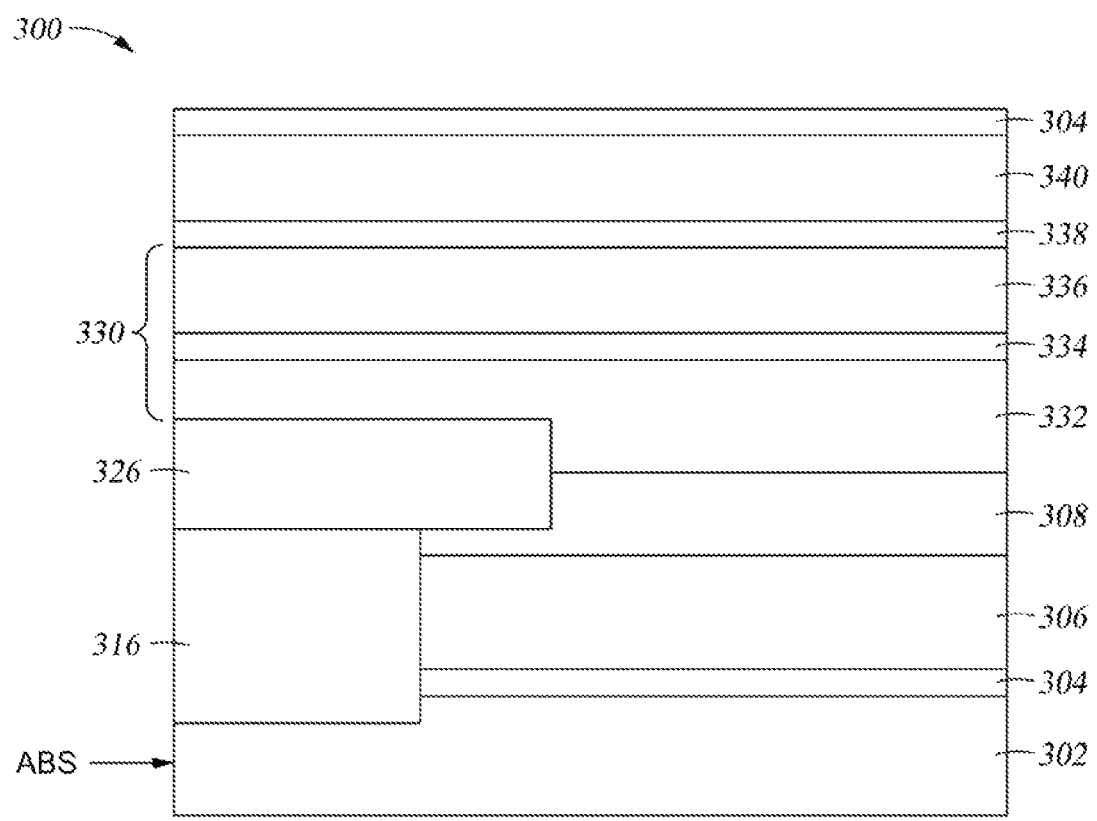
Figure 3M:
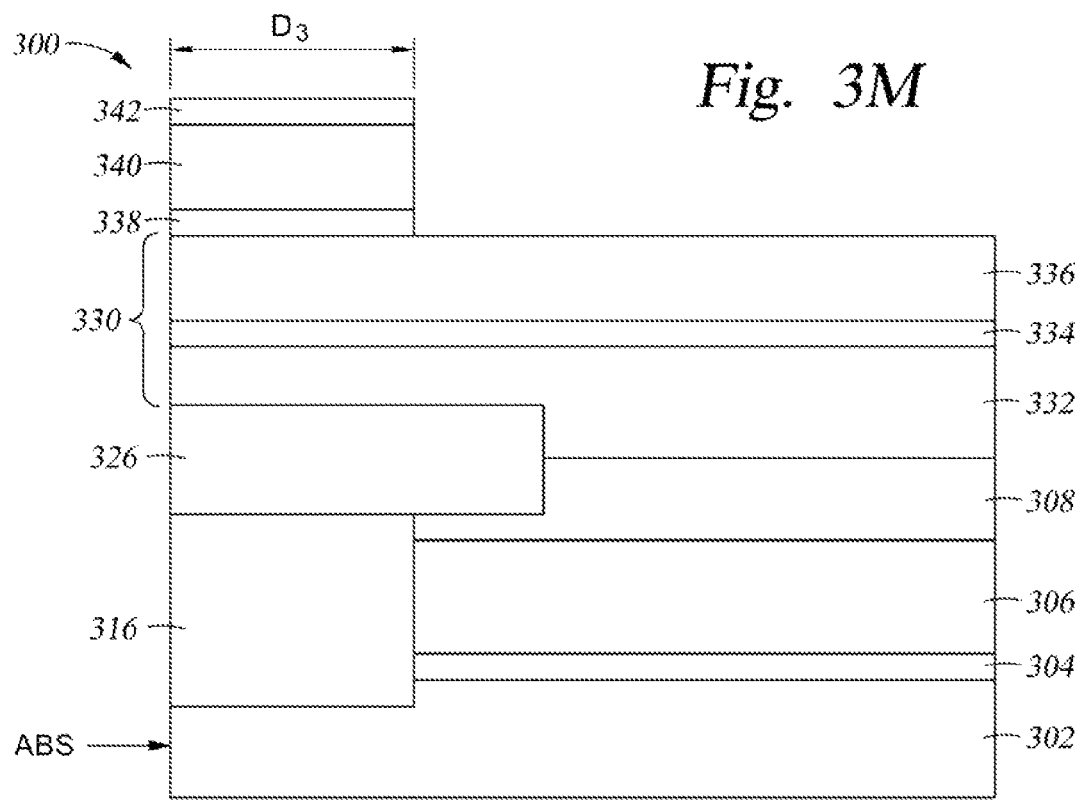
Figure 3N:
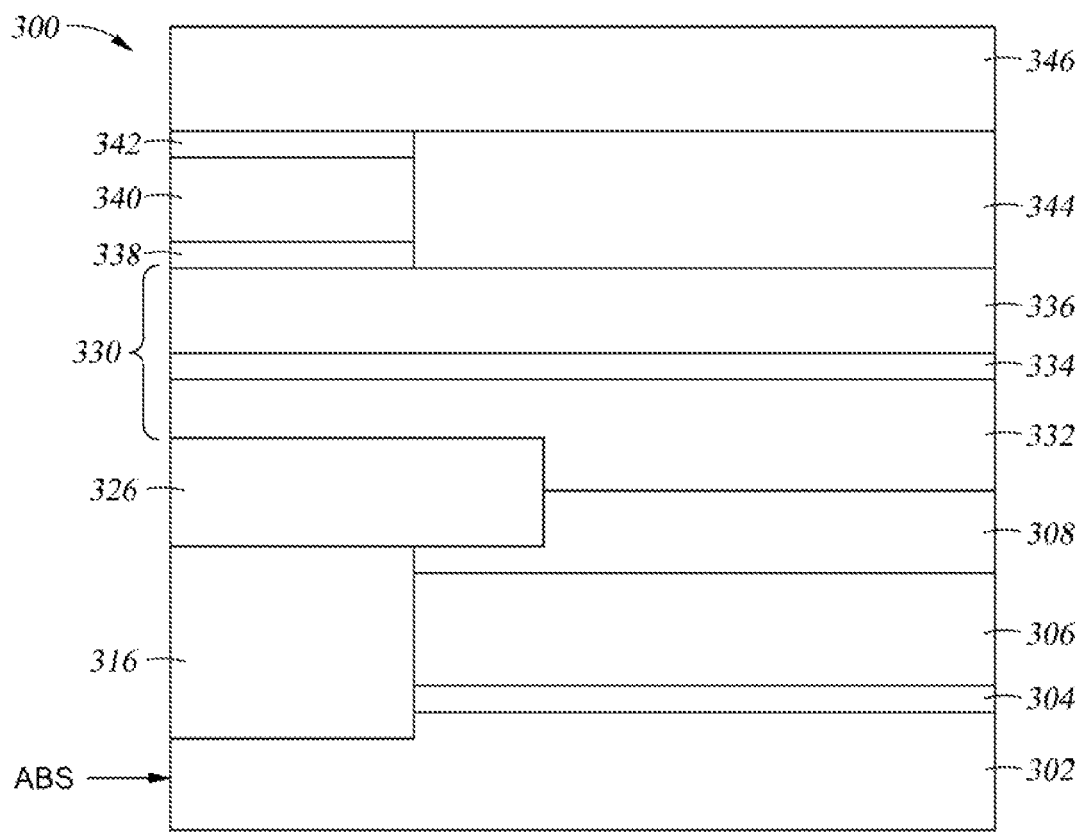

FIGS. 3A-3N illustrate the process of making the magnetic read head 211 according to one of the embodiments. FIG. 3A is a cross sectional side view of a sensor stack 300. The sensor stack 300 includes a first shield 302, a seed layer 304 formed on the first shield 302, an antiferromagnetic layer 306 formed on the seed layer 304, a magnetic layer 308 formed on the antiferromagnetic layer 306 and a capping layer 310 formed on the magnetic layer 308. The first shield 302 may be the shield S1 and may comprise a ferromagnetic material. Suitable ferromagnetic materials that may be utilized include Ni, Fe, Co, NiFe, NiFeCo, NiCo, CoFe and combinations thereof. The seed layer 304 may comprise Ta or Ru. The antiferromagnetic layer 306 may comprise Pt, Ir, Rh, Ni, Fe, Mn, or combinations thereof and the magnetic layer 308 may comprise NiFe, CoFe, CoFeB, Co, CoZr, CoHf, or CoFeTaB. The capping layer 310 may be a sacrificial cap that is removed during the process and may not be present in the final structure. The layers 302, 304, 306, 308 and 310 may be deposited by physical vapor deposition (PVD), chemical vapor deposition, ion beam deposition (IBD) or any other suitable deposition method. The first shield 302, the seed layer 304, the antiferromagnetic layer 306 and the magnetic layer 308 all extend to the ABS.

Next, as shown in FIG. 3B, a diamond like carbon (DLC) layer 312 is formed on the capping layer 310 and a resist 314 is formed on a portion of the DLC layer 312. The resist 314 may be formed by deposition followed by patterning. The resist 314 is recessed from the ABS by a distance D1. In one embodiment, the distance D1 is between 30 and 500 nanometers (nm). A portion of the DLC layer 312 not covered by the resist 314 is removed, as shown in FIG. 3C. The removal may be performed by any suitable removal process, such as a reactive ion etching (RIE) process. During the RIE process, a portion of the resist 314 may be also removed, resulting in a thinner resist 314. As a result of the RIE process, a portion of the capping layer 310 extending to the ABS is exposed.

The exposed capping layer 310 and a portion of the magnetic layer 308, a portion of the antiferromagnetic layer 306 and a portion of the seed layer 304 that are disposed under the exposed capping layer 310 are removed, exposing a portion of the first shield layer 302, as shown in FIG. 3D. The removal process may be any suitable removal process, such as an ion milling process. The ion milling process may not stop right at the first shield 302, so a portion of the first shield 302 may be also removed. As a result of the ion milling process, the antiferromagnetic layer 306 and the magnetic layer 308 are recessed from the ABS by the distance D1. A shielding material 316 is deposited on the exposed portion of the first shield layer 302 and on the resist 314, as shown in FIG. 3E. The shielding material 316 may be the same material as the first shield layer 302 and may be deposited by any suitable deposition method, such as PVD or CVD.

Next, the resist 314 and the portion of the shielding material 316 disposed on the resist 314 are removed, and a top surface 317 of the sensor structure 300 is planarized by a chemical mechanical polish (CMP) process, as shown in FIG. 3F. The removal process may be any suitable removal process, such as a liftoff process. A second resist 318 is formed on a portion of the DLC layer 312, and the portion of the DLC layer 312 not covered by the resist 318 is removed, as shown in FIG. 3G. Again the removal process may be any suitable removal process, such as an RIE process. As a result, the resist 318 and the DLC layer 312 are not aligned with the capping layer 310, the magnetic layer 308 and the antiferromagnetic layer 306 at an end 320, and are a distance D2 away from the end 320 of the capping layer 310, the magnetic layer 308 and the antiferromagnetic layer 306. The distance D2 may range from about 1 nm to about 40 nm. In one embodiment, the distance D2 is about 20 nm. Next, a removal process is performed to remove a portion of the capping layer 310, a portion of the magnetic layer 308, and a portion of the shielding material 316 not covered by the resist 318, as shown in FIG.

3H. The removal process may be any suitable removal process, such as an ion milling process. As a result of the ion milling process, the magnetic layer 308 has a first portion 322 having a first thickness T1 and a second portion 324 having a second thickness T2, and T2 is greater than T1. In one embodiment, T1 is about 1 nm. The first portion 322 may have a width D2 that ranges from about 1 nm to about 40 nm. A seed layer 326 is then deposited on the shielding material 316, the first portion 322 and the resist 320, as shown in FIG. 3I. The seed layer 326 may be a single layer of Ta or Ru, or a bilayer structure having a Ru layer and a Ta layer. In one embodiment, the Ru layer is disposed on the Ta layer. The seed layer 326 may be deposited by any suitable deposition method, such as PVD or CVD.

The resist 318 and the portion of the seed layer 326 disposed on the resist 318 are removed, and a top surface 328 of the sensor stack 300 is planarized by a CMP process, as shown in FIG. 3J. The removal process may be any suitable removal process, such as a liftoff process. The remaining seed layer 326 may have a thickness ranging from about 1 nm to about 10 nm. In one embodiment, the seed layer 326 is a single layer of Ru and has a thickness of about 4 nm. Next, the DLC layer 312 and the capping layer 310 are removed by any suitable removal process, as shown in FIG. 3K. In one embodiment, the DLC layer 312 is removed by an RIE process and the capping layer 310 is removed by an ion milling process. The resulting structure as shown in FIG. 3K has a top surface 329.

The top surface 329 may be exposed to oxygen, forming an oxide layer on the surface 329. An etch process may be performed to remove the oxide layer prior to further deposition of layers on the surface 329. Next, a pinned layer structure 330 is formed on the seed layer 326 and the magnetic layer 308, a tunnel barrier or spacer layer 338 is formed on the pinned layer structure 330, a free layer 340 is formed on the spacer layer 338 and a capping layer 342 is formed on the free layer 340, as shown in FIG. 3L. The pinned layer structure 330 may comprise an antiparallel (AP) pinned structure having a first magnetic layer 332, a second magnetic layer 336 and a nonmagnetic AP coupling layer 334 sandwiched between the two magnetic layers 332, 336. The first magnetic layer 332 may be comprised of the same material as the magnetic layer 308. The first and second magnetic layers 332, 336 may be constructed of several magnetic materials such as, for example NiFe, CoFe, CoFeB, Co, CoZr, CoHf or CoFeTaB. The nonmagnetic layer 334 may comprise Ru.

The tunnel barrier or spacer layer 338 may comprise an insulating material such as MgO, $TiO_2$ or alumina, or a metallic spacer layer such as Cu, Ag, or AgSn for current perpendicular to the plane (CPP)-GMR sensors. The free layer 340 may comprise ferromagnetic materials such as Co, CoFe, CoFeB, NiFe, CoHf or combinations thereof. The capping layer 342 may comprise a material such as Ru, Ta or a layered structure of these materials.

Next, a portion of the spacer layer 338, a portion of the free layer 340, a portion of the capping layer 342 that are recessed from the ABS are removed, exposing underlying pinned layer structure 330, as shown in FIG. 3M. The removal process may be one or more suitable removal process, such as RIE and/or ion milling. The remaining of the three layers, spacer layer 338, free layer 340 and capping layer 342 are extending to the ABS and have a width D3. In one embodiment, the width D3 is about 20 to 100 nm. A dielectric material 344 is deposited on the exposed pinned layer structure 330, as shown in FIG. 3N. The dielectric material 344 is recessed from the ABS and adjacent the spacer layer 338, the free layer 340 and the capping layer 342. A CMP process may be performed on so the dielectric material 344 is planar with the capping layer 342. A second shield 346 is then formed on the capping layer 342 and the dielectric material 344. The second shield 342 may be the shield S2 and may comprise the same material as the first shield 302.

Figure 4A:
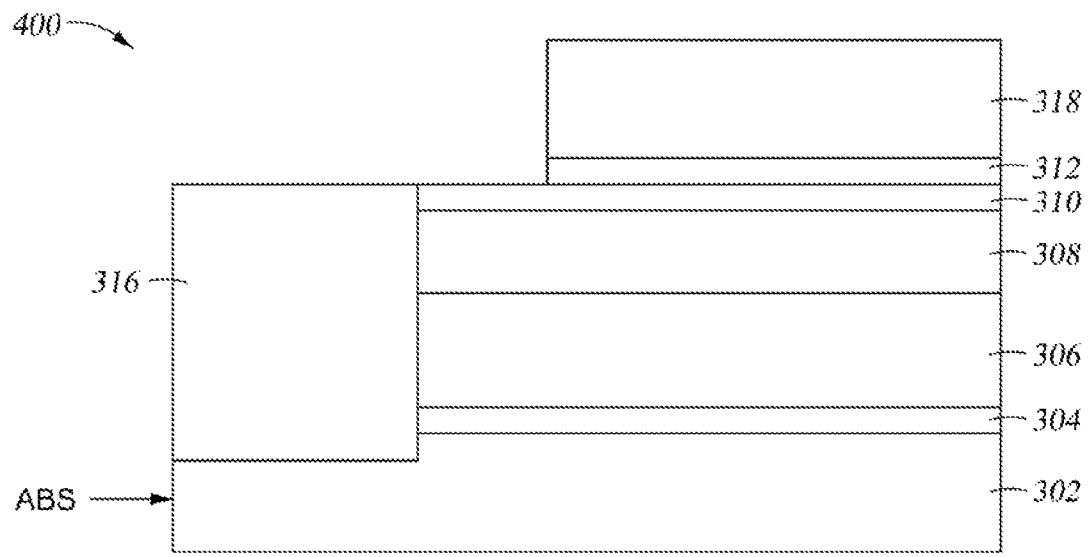
FIGS. 4A-4D illustrate the process of making the magnetic read head according to one embodiment.
Figure 4B:
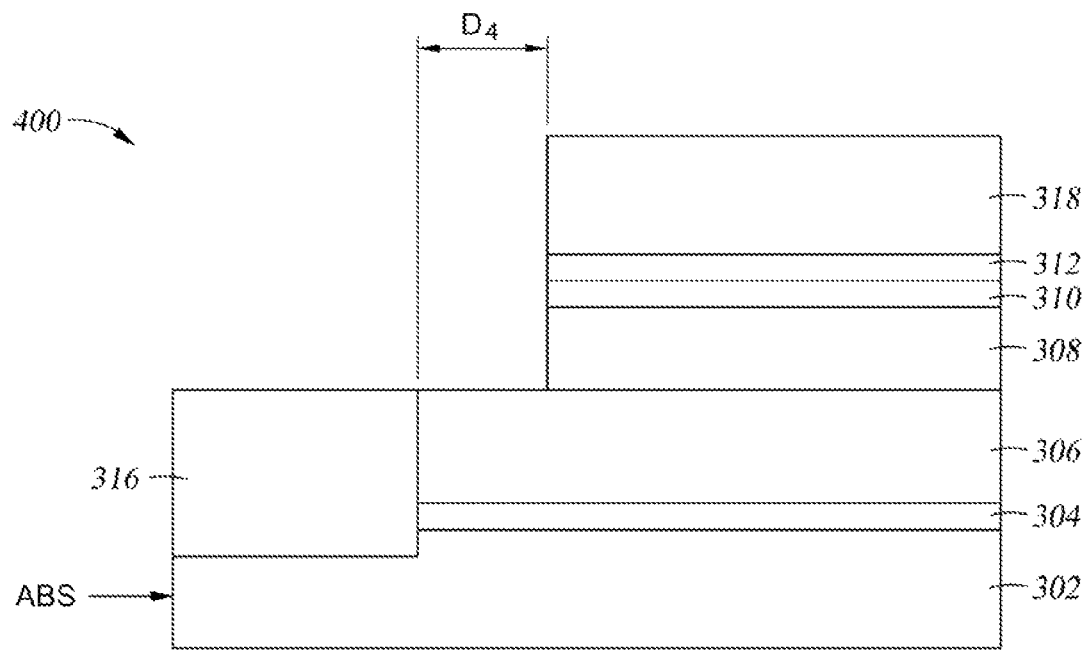
Figure 4C:
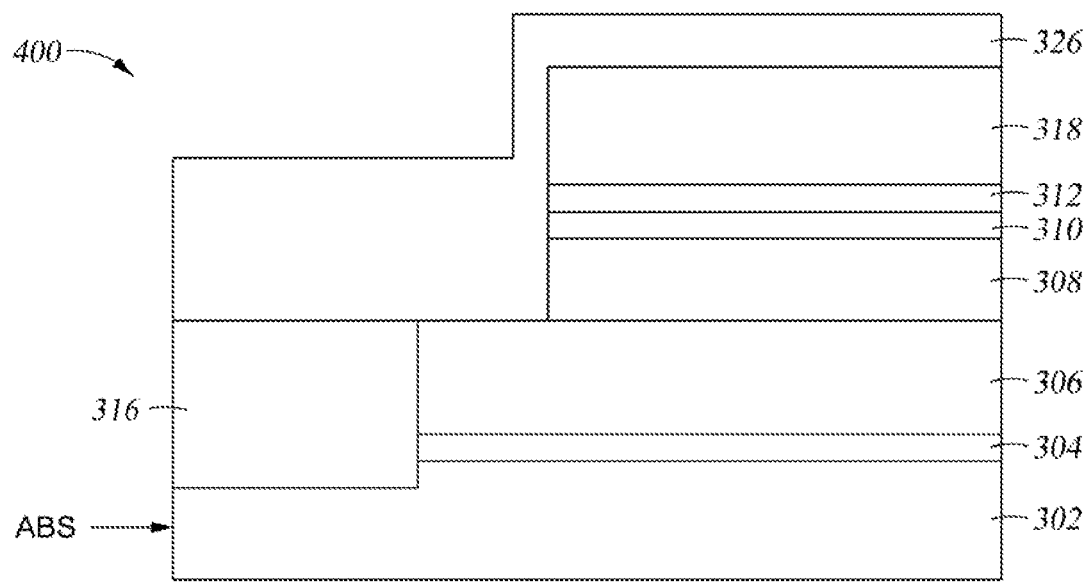
Figure 4D:
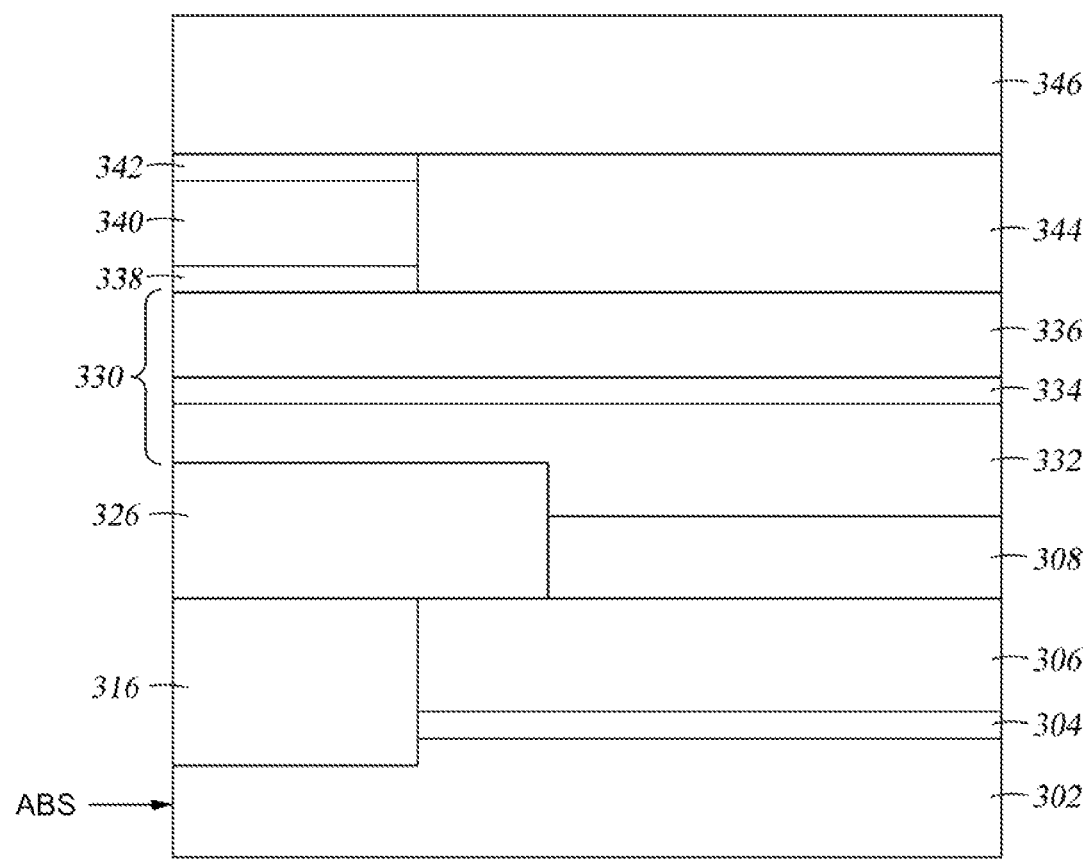

FIGS. 3A-3N illustrate a process of making the magnetic read head 211 having the antiferromagnetic layer 306 that is recessed from the ABS. Consequently, the read gap thickness is reduced and the sensor performance is improved. FIGS. 4A-4D illustrate an alternative process of making the read head 211. FIG. 4A shows the sensor stack 400 that is identical to the sensor stack 300 described in FIG. 3G. Next, a portion of the shielding material 316, a portion of the capping layer 310 and a portion of the magnetic layer 308 are removed to expose a portion of the antiferromagnetic layer 306, as shown in FIG. 4B. The exposed portion of the antiferromagnetic layer 306 may have a width D4 ranging from about 1 nm to about 40 nm. This removal process completely removes a portion of the magnetic layer 308 that is not covered by the resist 318. In one embodiment, the removal process also removes a portion of the antiferromagnetic layer 306. The resulting magnetic layer 308 does not have two portions having different thicknesses, as described in FIG. 3H. Next, the seed layer 326 is deposited on the shielding material 316, the exposed portion of the antiferromagnetic layer 306 and the resist 318, as shown in FIG. 4C. Following the same process steps described in FIGS. 3J to 3N, the finished sensor stack 400 is shown in FIG. 4D. As shown in FIG. 4D, the seed layer 326 is disposed on the shielding material 316 and a portion of the antiferromagnetic layer 306.

In summary, a method for forming a magnetic read head having an antiferromagnetic layer that is recessed from the ABS is disclosed. The method includes removing a portion of the antiferromagnetic layer and magnetic layer that are at the ABS to expose the underlying shield and depositing a shielding material on the exposed shield. Through one or more removal and/or planarization processes, the shielding material is planar with either a portion of the magnetic layer or the antiferromagnetic layer. A seed layer is deposited on the shielding material and the portion of the magnetic layer or on the shielding material and the antiferromagnetic layer. The pinned layer structure, the spacer layer and the free layer are then formed on the seed layer and a second portion of the magnetic layer.

While the foregoing is directed to embodiments of the present invention, other and further embodiments of the invention may be devised without departing from the basic scope thereof, and the scope thereof is determined by the claims that follow.

What is claimed is:
1. A method for forming a magnetic read head, comprising:
depositing an antiferromagnetic layer over a first shield;
depositing a first magnetic layer over the antiferromagnetic layer, wherein the first shield, the antiferromagnetic layer and the first magnetic layer have a first portion extending to an air bearing surface (ABS);
removing the first portion of the magnetic layer and the first portion of the antiferromagnetic layer to expose the first portion of the first shield, wherein the magnetic layer and the antiferromagnetic layer are recessed from the ABS by a distance;
depositing a shielding material over the first portion of the first shield;
removing a portion of the shielding material and a second portion of the first magnetic layer to expose a second portion of the antiferromagnetic layer;

depositing a seed layer over the shielding material and the second portion of the antiferromagnetic layer;

depositing a pinned layer structure over the seed layer and a third portion of the first magnetic layer;

depositing a tunnel barrier or spacer layer over the pinned layer structure; and depositing a free layer over the tunnel barrier or spacer layer.

2. The method of claim 1, further comprising removing a portion of the free layer and the tunnel barrier or spacer layer that is recessed from the air bearing surface to expose the pinned layer structure.

3. The method of claim 2, wherein the free layer extends to the air bearing surface and has a width of about 20 to 100 nm.

4. The method of claim 3, further comprising depositing a dielectric material over the exposed pinned layer structure.

5. The method of claim 4, further comprising depositing a second shield over the free layer and the dielectric material.

6. The method of claim 1, wherein the distance is about 30 to 500 nm.

7. The method of claim 1, wherein the second portion of the antiferromagnetic layer has a width ranging from about 1 nm to about 40 nm.

8. The method of claim 1, wherein the seed layer includes Ta or Ru.

9. The method of claim 1, wherein the seed layer is a bilayer structure including a layer of Ru and a layer of Ta.

10. A method for forming a magnetic read head, comprising:

depositing an antiferromagnetic layer over a first shield;

depositing a first magnetic layer over the antiferromagnetic layer, wherein the first shield, the antiferromagnetic layer and the first magnetic layer have a first portion extending to an air bearing surface (ABS);

removing the first portion of the magnetic layer and the first portion of the antiferromagnetic layer to expose the first portion of the first shield, wherein the magnetic layer and the antiferromagnetic layer are recessed from the ABS by a distance;

depositing a shielding material over the first portion of the first shield;

removing a portion of the shielding material and a second portion of the first magnetic layer so the remaining first magnetic layer has a third portion having a first thickness and a fourth portion having a second thickness, wherein the second thickness is greater than the first thickness;

depositing a seed layer over the shielding material and the third portion of the first magnetic layer;

depositing a pinned layer structure over the seed layer and the fourth portion of the first magnetic layer;

depositing a tunnel barrier or spacer layer over the pinned layer structure; and depositing a free layer over the tunnel barrier or spacer layer.

11. The method of claim 10, further comprising removing a portion of the free layer and the tunnel barrier or spacer layer that is recessed from the air bearing surface to expose the pinned layer structure.

12. The method of claim 11, wherein the free layer extends to the air bearing surface and has a width of about 20 to 100 nm.

13. The method of claim 12, further comprising depositing a dielectric material over the exposed pinned layer structure.

14. The method of claim 13, further comprising depositing a second shield over the free layer and the dielectric material.

15. The method of claim 10, wherein the distance is about 30 to 500 nm.

16. The method of claim 10, wherein the third portion of the magnetic layer has a width ranging from about 1 nm to about 40 nm.

17. A method for forming a magnetic read head, comprising:

depositing a first seed layer on a first shield;

depositing an antiferromagnetic layer on the first seed layer;

depositing a first magnetic layer on the antiferromagnetic layer;

depositing a capping layer on the first magnetic layer;

depositing a diamond like carbon layer on the capping layer, wherein the first shield, the antiferromagnetic layer, the first magnetic layer, the capping layer and the diamond like carbon layer have a first portion extending to an air bearing surface (ABS);

removing the first portion of the first seed layer, the first portion of the antiferromagnetic layer, the first portion of the first magnetic layer, the first portion of the capping layer and the first portion of the diamond like carbon layer to expose the first portion of the first shield, wherein the first seed layer, the antiferromagnetic layer, the magnetic layer, the capping layer and the diamond like carbon layer are recessed from the ABS by a distance;

depositing a shielding material on the first portion of the first shield;

removing a portion of the shielding material and a second portion of the first magnetic layer so the remaining first magnetic layer has a third portion having a first thickness and a fourth portion having a second thickness, wherein the second thickness is greater than the first thickness;

depositing a second seed layer on the shielding material and the third portion of the first magnetic layer;

depositing a pinned layer structure on the first seed layer and the fourth portion of the first magnetic layer;

depositing a tunnel barrier or spacer layer on the pinned layer structure; and depositing a free layer on the tunnel barrier or spacer layer.

18. The method of claim 17, further comprising removing a portion of the free layer and the tunnel barrier or spacer layer that is recessed from the air bearing surface to expose the pinned layer structure.

19. The method of claim 18, wherein the free layer extends to the air bearing surface and has a width of about 20 to 100 nm.

20. The method of claim 17, wherein the distance is about 30 to 500 nm.

* * * * *